United States Patent
Ishikawa

(10) Patent No.: US 8,953,409 B2
(45) Date of Patent: Feb. 10, 2015

(54) SEMICONDUCTOR DEVICE CAPABLE OF MINIMIZING MUTUAL EFFECTS BETWEEN TWO DIFFERENT OPERATIONS THEREIN

(75) Inventor: Toru Ishikawa, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 457 days.

(21) Appl. No.: 12/929,965

(22) Filed: Feb. 28, 2011

(65) Prior Publication Data

US 2011/0216612 A1 Sep. 8, 2011

(30) Foreign Application Priority Data

Mar. 8, 2010 (JP) ................... 2010-050018

(51) Int. Cl.
*G11C 8/18* (2006.01)
*G11C 7/00* (2006.01)

(52) U.S. Cl.
CPC ........................ *G11C 7/00* (2013.01)
USPC ............ 365/233.12; 365/233.11; 365/233.14; 365/222; 365/194; 365/198; 365/236

(58) Field of Classification Search
USPC ............... 365/233.11, 233.12, 233.14, 233.1, 365/222, 194, 198, 191, 236
See application file for complete search history.

(56) References Cited

U.S. PATENT DOCUMENTS

| 7,839,159 | B2 | 11/2010 | Nakamura et al. | |
| 8,144,529 | B2 * | 3/2012 | Chuang et al. | 365/194 |
| 8,411,517 | B2 * | 4/2013 | Choi | 365/194 |
| 2007/0148796 | A1 | 6/2007 | Nakamura et al. | |

FOREIGN PATENT DOCUMENTS

| JP | 2005-292947 A | 10/2005 |
| JP | 2007-123987 | 5/2007 |

* cited by examiner

*Primary Examiner* — Andrew Q Tran
(74) *Attorney, Agent, or Firm* — McGinn IP Law Group, PLLC

(57) ABSTRACT

A device includes a control circuit that triggers a first operation every time a specific signal is supplied thereto, and that triggers a second operation in place of the first operation in response to the first specific signal supplied after the number of the first operation performed has reached a predetermined number.

23 Claims, 7 Drawing Sheets

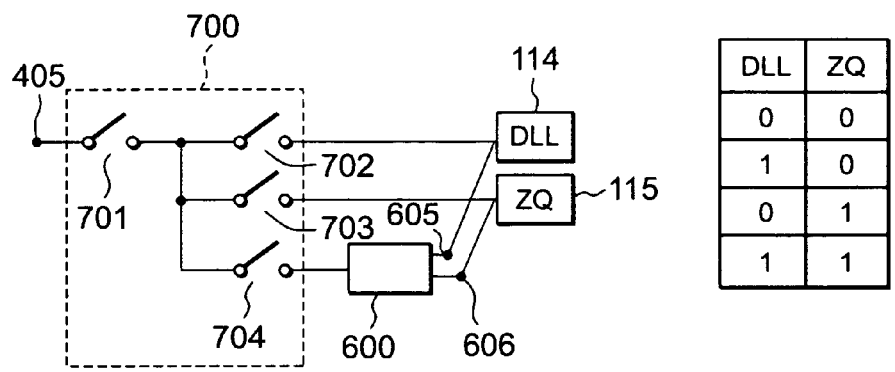
FIG. 7A
FIG. 7B
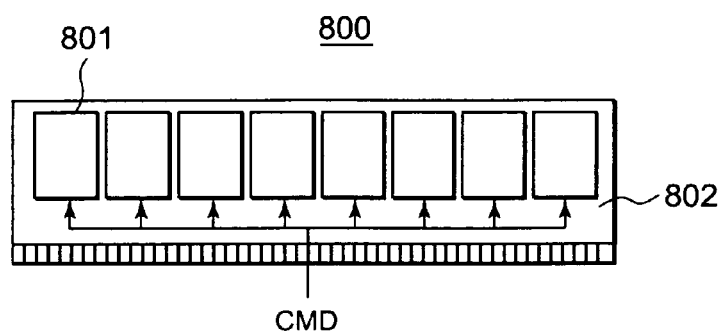
FIG. 8

SEMICONDUCTOR DEVICE CAPABLE OF MINIMIZING MUTUAL EFFECTS BETWEEN TWO DIFFERENT OPERATIONS THEREIN

This application is based upon and claims the benefit of priority from Japanese Patent application No. 2010-050018, filed on Mar. 8, 2010, the disclosure of which is incorporated herein in its entirety by reference.

BACKGROUND OF THE INVENTION

This invention relates to a device such as a semiconductor device having a refresh function, and a control method thereof.

A semiconductor device including a volatile memory element is required to perform a refresh operation periodically to maintain information held in the volatile memory element. Such periodical operation may be utilized to trigger another operation.

For example, US2007/0148796A1, or JP2007-123987A (Patent Document 1) discloses a technique in which an impedance adjustment (ZQ calibration) at an external terminal is carried out together with a refresh operation in synchronization with a refresh cycle.

JP2005-292947A (Patent Document 2) discloses a technique in which variable delay data from a DLL (Delay-Locked Loop) is updated together with a refresh operation in synchronization with the refresh operation.

SUMMARY

When a refresh operation is performed in a semiconductor device having a volatile memory cell, a sense operation is performed simultaneously by a plurality of banks provided in the semiconductor device. Therefore, the electrical current consumed by the sense operation occupies a relatively large part in the entire current consumption of the semiconductor device. In addition, the current consumed by operations such as ZQ calibration and updating of DLL delay values also occupies a relatively large part in the entire current consumption of the semiconductor device. These operations requiring high current consumption may generate noise in the chip (in the semiconductor device), which may result in mutually affecting the operations (of others). When several operations requiring high current consumption are performed simultaneously, the noise generated in the chip is increased. Normally, these operations are not performed simultaneously in a semiconductor device. However, if these operations are performed simultaneously, an error may occur in sensing operation of each of the refresh operation, the ZQ calibration operation, and the DLL adjustment operation.

The present invention seeks to provide a device capable of minimizing the mutual effect between two different operations when the start of an operation is utilized to trigger another operation.

In one embodiment, there is provided a device that includes a control circuit triggering a first operation every time a specific signal is supplied thereto, and triggering a second operation in place of the first operation in response to the first specific signal supplied after the number of the first operation performed has reached a predetermined number.

In another embodiment, there is provided a system that includes a semiconductor device including a control circuit triggering a first operation every time a specific signal is supplied, and triggering a second operation in place of the first operation in response to the first specific signal supplied after the number of the first operations performed has reached a predetermined number, and a controller supplying the specific signal to the semiconductor device.

BRIEF DESCRIPTION OF THE DRAWINGS

The above features and advantages of the present invention will be more apparent from the following description of certain preferred embodiments taken in conjunction with the accompanying drawings, in which:

FIG. 7A is a circuit diagram illustrating a configuration example of a route selector included in a semiconductor device according to a third embodiment of this invention;

FIG. 7B is a table representing a data set for controlling in the route selector of FIG. 7B;

FIG. 8 is a schematic diagram illustrating a semiconductor device according to a fourth embodiment of this invention;

DESCRIPTION OF PREFERRED EMBODIMENTS

Figure 1:
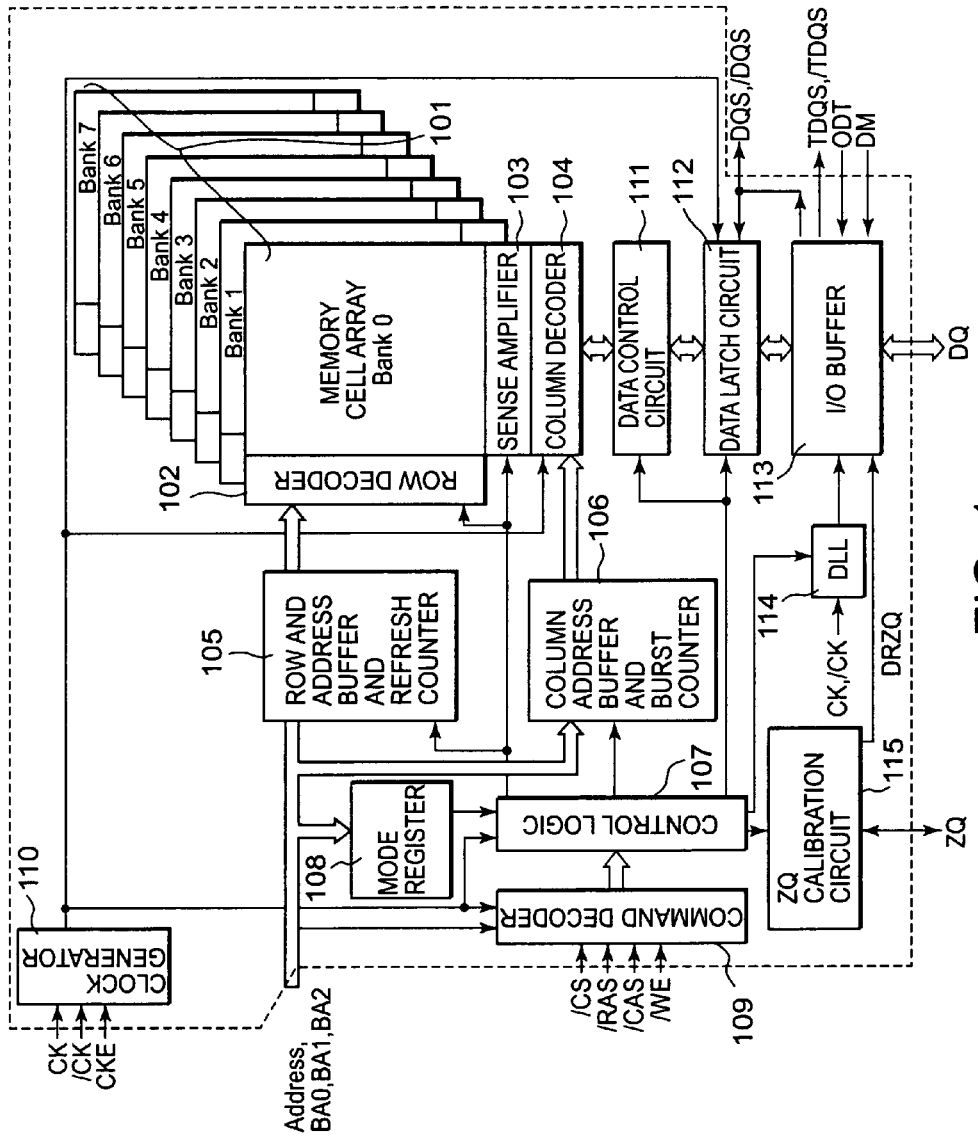
FIG. 1 is a block diagram schematically illustrating a configuration of a semiconductor device according to a first embodiment of this invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

A representative example of a technical idea (concept) for achieving the object of this invention will be described below. However, it should be understood that what is claimed in this application is not limited to this technical idea, but is defined only by the appended claims.

A semiconductor device according to an aspect of this invention triggers a first operation (e.g., operation of a refresh counter 105) every time a specific signal is supplied thereto from at least one of external and internal timers via a command decoder 109. Once the number of the first operations has reached a predetermined number, the semiconductor device triggers a second operation (updating of a DLL 114 or ZQ calibration of ZQ calibration circuit 115) in place of the first operation in response to the next specific signal supplied thereto. For example, the specific signal may be a refresh command signal, and the first operation may be a refresh operation. Every time the first operation is performed for $2^n$ times (n is a natural number), the second operation instead of the first operation is performed in response to the next specific signal. As such, the first operation is not performed while the second operation is performed. The second operation may be, for example, a delay value updating operation of the DLL (Delay-Locked Loop) or a ZQ calibration operation. Taking an example, every time the refresh operation is performed for 32 times (n=5) in response to the refresh command signal, the DLL delay value updating operation or ZQ calibration instead of the refresh operation is performed in response to the next refresh command signal. Assuming that the refresh of 32 word lines (refresh addresses) to be refreshed is completed by the refresh operations corresponding to 32 refresh commands, one set of operations on all the refresh addresses is completed by 33 refresh commands according to this invention. The DLL delay value updating operation or ZQ calibration is performed once by one of the 33 refresh commands. As such, the DLL delay value updating or ZQ calibration is performed by the $33^{rd}$ refresh command. These operations are performed under the control of a control circuit provided in the semiconductor device.

As described above, once the number of first operations performed in response to input of a specific signal has reached a predetermined number, the semiconductor device performs the second operation instead of the first operation in response to the next specific signal input. This enables the second operation to be performed periodically and at a different timing from the first operation (while the first operation is not performed). Thus, the mutual effects between the first and second operations can be minimized or eliminated.

With reference to the accompanying drawings, preferred exemplary embodiments of this invention will be described in detail.

FIG. 1 illustrates a configuration example of a semiconductor device according to a first embodiment of this invention. Although the semiconductor device illustrated here is a memory device, specifically a DRAM (Dynamic Random Access Memory), this invention is applicable not only to DRAMs but also other semiconductor devices.

The DRAM of FIG. 1 has a memory cell array 101 formed with a plurality of banks (here eight banks, bank0 to bank7), a row decoder 102 and a sense amplifier 103 corresponding to each of the banks, a column decoder 104, a row address buffer and refresh counter 105, a column address buffer and burst counter 106, a control logic (control circuit) 107, a mode register 108, a command decoder 109, a clock generator 110, a data control circuit 111, a data latch circuit 112, an I/O buffer 113, a DLL 114, and a ZQ calibration circuit 115.

The memory cell array 101 has a plurality of memory cells (not shown) arranged in array and connected to word lines (not shown) and bit lines (not shown).

The row decoder 102 decodes a row address output by the row address buffer and refresh counter 105 and selectively drives a word line of the memory cell array 101.

The sense amplifier 103 amplifies a potential difference generated between a bit line pair by data read from a memory cell.

The column decoder 104 decodes a column address output from the column address buffer and burst counter 106, and selectively connects a bit line of the memory cell array 101 to the I/O line (not shown).

The row address buffer and refresh counter 105 outputs, to the row decoder 102, a row address corresponding to an address signal input thereto or a count value of the refresh counter incorporated therein, under the control of the control logic 107.

The column address buffer and burst counter 106 outputs, to the column decoder 104, a column address corresponding to an address signal input thereto or a count value of the burst counter incorporated therein, under the control of the control logic 107.

The mode register 108 holds a data set defining operations of the DRAM. The data set is set and changed using address signals (including bank address signals BA0 to BA2).

The command decoder 109 receives a chip select signal /CS, a row address strobe signal /RAS, a column address strobe signal /CAS, and a write enable signal /WE, decodes a command consisting of a combination of these signals, and transmits the decoded command to the control logic 107.

The control logic 107 controls the respective units based on a command from the command decoder 109 and a data set established in the mode register 108.

The clock generator 110 generates or stops generating an internal clock to be used in the DRAM upon receiving complementary external clocks CK and /CK and a clock enable signal CKE.

The data control circuit 111 controls input and output of write data and read data.

The data latch circuit 112 latches the write data and the read data according to data strobe signals DQS and /DQS.

The I/O buffer 113 temporarily holds the write data from data terminals DQ and the read data to the data terminals DQ. Upon receiving a data mask signal DM during a write operation, the I/O buffer 113 masks input data. Further, upon receiving an on-die termination signal ODT, the I/O buffer 113 turns on or off the terminating resistance of each of the data terminals DQ, the terminals for the data strobe signals DQS and /DQS, and terminals for termination data strobes TDQS and /TDQS.

The DLL 114 generates a signal in delayed synchronization with the external clocks CK and /CK upon receiving these external clocks, and supplies the generated signal to the I/O buffer 113.

The ZQ calibration circuit 115 utilizes an external resistance connected to the ZQ terminal to generate a resistance control signal DRZQ for adjusting the output resistance of an output driver and the terminating resistance of each of the above-mentioned terminals, and outputs the resistance control signal DRZQ to the I/O buffer 113.

A configuration example of the DLL 114 will be described with reference to FIG. 2.

Figure 2:
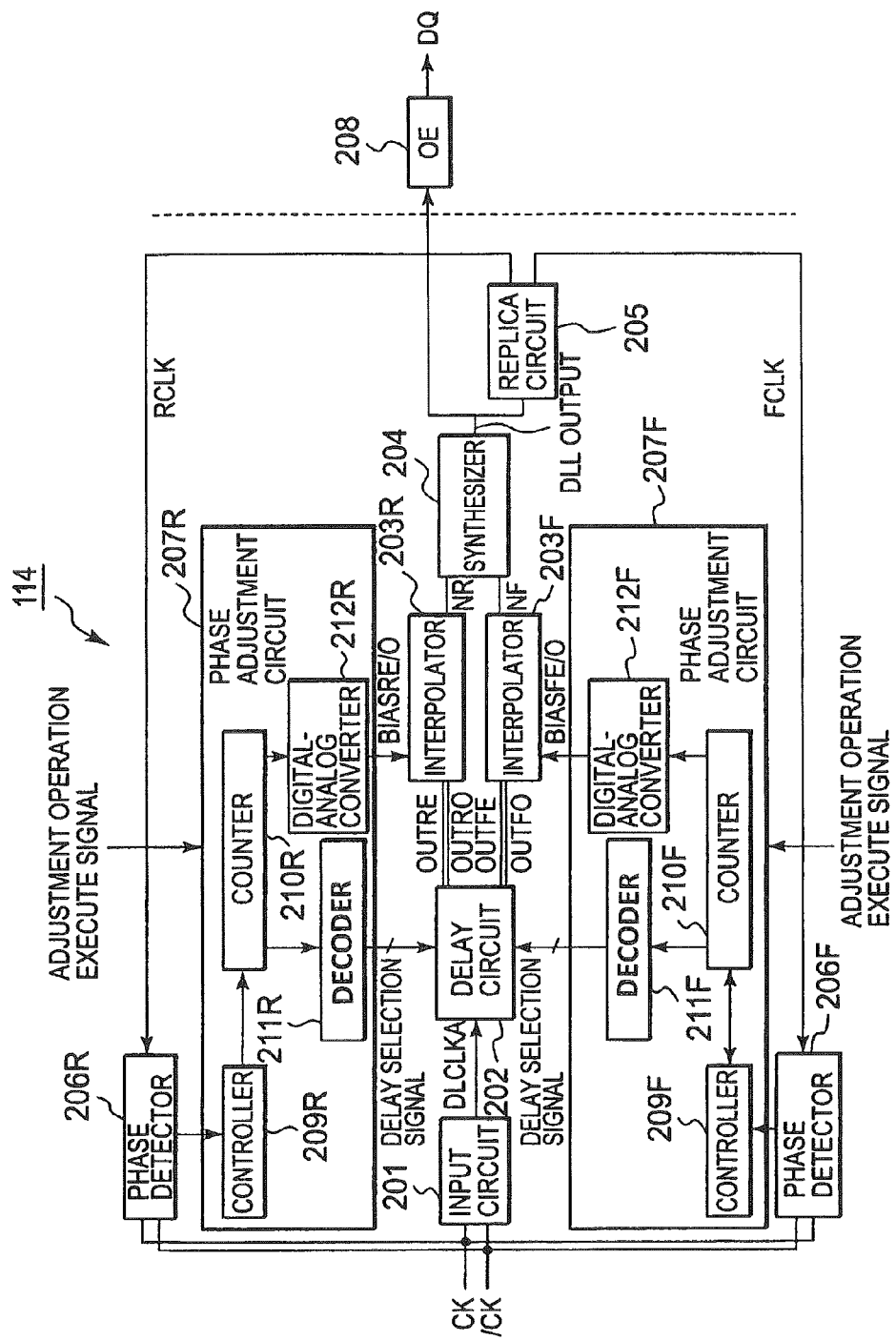
FIG. 2 is a block diagram illustrating a configuration example of a DLL included in the semiconductor device of FIG. 1.

The DLL 114 of FIG. 2 is configured to adjust the rising edge and the falling edge of its output signal. Generally, the part of the DLL 114 depicted in the upper part of FIG. 2 handles the adjustment of the rising edge, and the part of the DLL 114 depicted in the lower part handles the adjustment of the falling edge.

The DLL 114 of FIG. 2 has an input circuit 201, a delay circuit 202, interpolators 203R and 203F, a synthesizer 204, a replica circuit 205, phase detectors 206R and 206F, and phase adjustment circuits 207R and 207F.

The input circuit 201 outputs a single-end clock signal DLCLKA upon receiving the external clocks CK and /CK.

The delay circuit 202 has a rising edge detecting delay line (not shown) and a falling edge detecting delay line (not shown). The delay lines are each formed by connecting delay elements in multiple stages. The clock signal DLCLKA from the input circuit 201 is branched and supplied to the delay lines. In response to a delay selection signal from the phase adjustment circuit 207R, the delay circuit 202 outputs an output from one of the even-number-th delay elements on the rising edge detecting delay line and an output from the subsequent odd-number-th delay element, as delay signals OUTRE and OUTRO. Further, in response to a delay selection signal from the phase adjustment circuit 207F, the delay circuit 202 logically inverts an output from one of the even-number-th delay elements on the falling edge detecting delay line and an output from the subsequent odd-number-th delay element by means of an inverter, and outputs as delay signals OUTFE and OUTFO. The logic inversion by the inverter is performed in order to facilitate subsequent processes. Thus, the delay signals OUTFE and OUTFO are each output as a signal having a rising edge corresponding to the detected falling edge.

The interpolators 203R and 203F respectively delay and synthesize delay signals from the delay circuit 202 in response to bias signals BIASRE/O and BIASFE/O from the phase adjustment circuits 207R and 207F. Specifically, the interpolator 203R synthesizes the delay signals OUTRE and OUTRO, while the interpolator 203F synthesizes the delay signals OUTFE and OUTFO. The interpolator 203R synthesizes the delay signals OUTRE and OUTRO such that the rising timing of its output NR is a timing that is defined by a bias signal BIASRE/O to be between the rising timing of the delay signal OUTRE and the rising timing of the delay signal OUTRO. The interpolator 203F synthesizes the delay signals OUTFE and OUTFO such that the rising timing of its output NF is a timing that is defined by a bias signal BIASFE/O to be between the rising timing of the delay signal OUTFE and the rising timing of the delay signal OUTFO.

The synthesizer 204 generates a DLL output having a rising edge that rises at the rising timing of the output NR of the interpolator 203R, and a falling edge that falls at the rising timing of the output NF of the interpolator 203F. The DLL output from the synthesizer 204 is supplied to an output circuit (OE) 208 included in the I/O buffer 113 as well as to the replica circuit 205.

The replica circuit 205 is a circuit having a delay equivalent to the delay of an actual signal route from the output of the DLL output from the synthesizer 204 up to the output of data to the DQ terminal. The replica circuit 205 not only delays the DLL output but also generates a rising clock RCLK and a falling clock FCLK and supplies them to phase detectors 206R and 206F, respectively. The rising clock RCLK is a signal having a rising edge at the same timing as that of the rising edge of the DLL output, and the falling clock FCLK is a signal having a rising edge at the same timing as that of the falling edge of the DLL output.

The phase detector 206R detects a phase difference between the rising edge of the rising clock RCLK and the rising edge of the external clock CK and outputs a detection result to the phase adjustment circuit 207R.

The phase detector 206F detects a phase difference between the rising edge of the falling clock FCLK and the rising edge of the external clock /CK, and outputs a detection result to the phase adjustment circuit 207F.

The phase adjustment circuit 207R has a controller 209R, a counter 210R, a decoder 211R, and a digital-analog converter 212R.

According to the detection result received from the phase detector 206, the controller 209R outputs, to the counter 210R, a control signal indicating whether the phase of the clock RCLK is to be advanced or delayed.

The counter 210R counts up or down according to a control signal from the controller 209R.

The decoder 211R decodes predetermined high-order bits of the output of the counter 210R, and outputs it to the delay circuit 202 as a delay selection signal.

The digital-analog converter 212R converts predetermined low-order bits of the output of the counter 210R into an analog voltage signal, and outputs it as a bias signal BIASRE/O to the interpolator 203R.

The phase adjustment circuit 207F is configured in the same manner as the phase adjustment circuit 207R.

The DLL 114 configured as described above generates a DLL output that is delayed and synchronized with the external clock. The DLL 114 activate the counters 210R and 210F (and the phase detectors 206R, 206F and the controllers 209R, 209F) to update the count values (delay values) of the counters 210R and 210F according to the control signal (adjustment operation execute signal) from the control logic 107. With the exception of this update operation, the count values (delay value) of the counters 210R and 210F are fixed (operation of the counters is stopped) to achieve reduction of power consumption.

Next, a configuration example of the ZQ calibration circuit 115 will be described with reference to FIG. 3.

Figure 3:
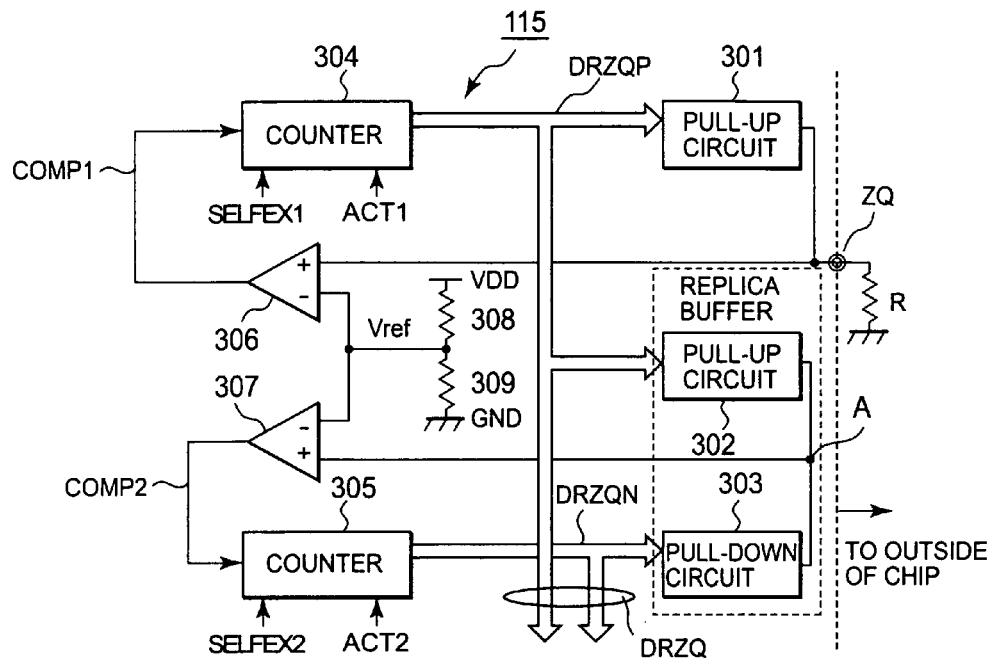
FIG. 3 is a block diagram illustrating a configuration example of a ZQ calibration circuit included in the semiconductor device of FIG. 1.

The ZQ calibration circuit 115 of FIG. 3 has pull-up circuits 301 and 302, a pull-down circuit 303, counters 304 and 305, comparators 306 and 307, and resistors 308 and 309.

The pull-up circuit 302 and the pull-down circuit 303 are formed by replicating the output circuit of the I/O buffer 113 (to form a replica buffer). The pull-up circuit 301 is also configured in the same manner as the pull-up circuit 302. The impedances of the pull-up circuits 301 and 302 are both controlled by a control signal DRZQP. The impedance of the pull-down circuit 303 is controlled by a control signal DRZQN. These control signals DRZQP and DRZQN are supplied to the I/O buffer 113 as an impedance control signal DRZQ for controlling the impedance of the output circuit of the I/O buffer 113.

The ZQ terminal is grounded via an external resistor R having a predetermined resistance value. The pull-up circuit 301 is connected between a power supply potential VDD (not shown) and the ZQ terminal. When the impedance of the pull-up circuit 301 is equal to the resistance value of the external resistor R, the potential of the ZQ terminal is equal to a half of the power supply potential VDD.

The resistors 308 and 309 are connected in series between the power supply potential VDD and a ground potential GND, and a reference potential Vref equal to a half of the power supply potential VDD is generated at the connection point thereof.

The comparator 306 compares the potential of the ZQ terminal and the reference potential Vref, and outputs a comparison result COMP1.

Upon the control signal ACT1 or SELFEX1 being activated, the counter 304 performs count operation according to the comparison result COMP1 received from the comparator 306. The counter 304 outputs a control signal DRZQP according to the count value, so that the impedances of the pull-up circuits 301 and 302 correspond with the resistance value of the external resistor R. The control signal DRZQP is used to control the impedance of a load side transistor in the output circuit of the I/O buffer 113, so that the impedance of the load side transistor in the output circuit corresponds with the resistance value of the external resistor R.

The pull-up circuit 302 is connected between the power supply potential VDD (not shown) and a node A, and the pull-down circuit 303 is connected between the node A and a ground potential GND (not shown). When the impedance of the pull-up circuit 302 is equal to the resistance value of the external resistor R, the impedance of the pull-down circuit 303 is equal to the resistance value of the external resistor R if the potential of the node A is equal to a half of the power supply potential VDD.

The comparator 307 compares the potential at the node A with the reference potential Vref and outputs a comparison result COMP2.

Upon the control signal ACT2 or SELFEX2 being activated, the counter 305 performs count operation according to the comparison result CMOP2 received from the comparator 307. The counter 305 then outputs a control signal DRZQN according to the count value, so that the impedance of the pull-down circuit 303 corresponds with the impedance of the pull-up circuit 302. Since the impedance of the pull-up circuit 302 is previously matched with the resistance value of the external resistor R, the impedance of the pull-down circuit 303 is consequently corresponds with the resistance value of the external resistor R. The control signal DRZQN is used to control the impedance of a driver-side transistor in the output circuit of the I/O buffer 113, so that the impedance of the driver-side transistor in the output circuit coincides with the resistance value of the external resistor R.

As described above, the ZQ calibration circuit 115 performs ZQ calibration (output impedance adjustment of the output circuit of the I/O buffer 113) as required according to the control signals ACT1 and ACT2, or the control signals SELFEX1 and SELFEX2. The controls signals ACT1 and ACT2 are control signals based on a command, whereas the controls signals SELFEX1 and SELFEX2 are control signals generated by the control logic 107 when predetermined conditions are satisfied.

Next, the control logic 107 will be described with reference to FIG. 4. The description here will be made only of the parts directly related to this invention in the internal configuration of the control logic 107, while the description of the other parts will be omitted. Although the following description will be made of a case in which a refresh (Ref) command signal is used as the specific signal (or a case of a refresh execute signal generating circuit), the invention is not limited to this, but other signals may be used as the specific signal. Any signal can be used as the specific signal as long as it can be repeatedly generated, but need not necessarily be generated at constant intervals.

Figure 4:
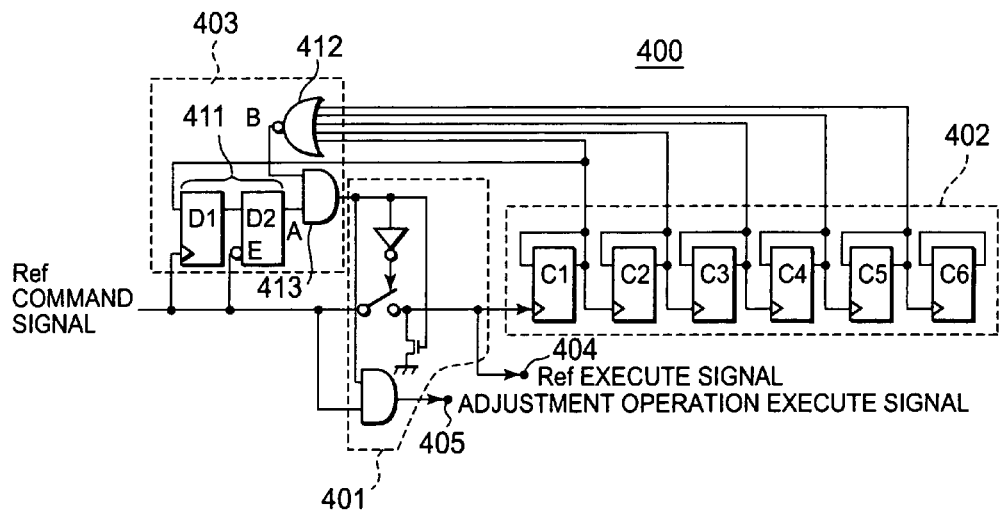
FIG. 4 is a circuit diagram illustrating a configuration example of a refresh execute signal generator of a control logic included in the semiconductor device of FIG. 1.

FIG. 4 is a diagram illustrating a configuration example of a refresh (Ref) execute signal generation circuit 400 included in the control logic 107. This Ref execute signal generation circuit 400 is a circuit outputting a refresh (Ref) execute signal or adjustment operation execute signal in response to a refresh (Ref) command signal from the command decoder 109. The Ref command signal, the Ref execute signal, and the adjustment operation execute signal are rectangular pulse signals. The Ref execute signal generation circuit 400 can also be regarded as a circuit for outputting a received specific signal as a Ref execute signal or adjustment operation execute signal.

The Ref execute signal generation circuit 400 has an execute signal output unit 401, a counter 402, and a selection indicating unit 403.

Upon receiving input of the Ref command signal, the execute signal output unit 401 selectively outputs either one of the Ref execute signal and the adjustment operation execute signal according to the selection indicating signal from the selection indicating unit 403.

The Ref execute signal is output to a first terminal 404 as a first execute signal for triggering a first operation, and adjustment operation execute signal is output to a second terminal 405 different from the first terminal 404 as a second execute signal for triggering a second operation different from the first operation.

Specifically, the Ref execute signal is supplied through the first terminal 404 to the components for performing the refresh operation, such as the row address buffer and refresh counter 105, and also supplied to the counter 402.

The adjustment operation execute signal is supplied through the second terminal 405 to one of the DLL 114 and the ZQ calibration circuit 115 as described later.

The counter 402 is formed by connecting one-bit counters (e.g., D flip-flops) in multiple stages (here, six stages C1~C6) to count (here, to count down) the number of the output Ref execute signals (the number of pulses). This counter 402 may be provided by utilizing the refresh counter (or a part thereof) provided in the row address buffer and refresh counter 105. In this case, the refresh counter functions as a part of the control circuit.

The count value of the counter 402 is transmitted to the selection indicating unit 403. It is determined, by the number of digits (number of bits) of the count value transmitted to the selection indicating unit 403, how every inputs of the Ref command signal the adjustment operation execute signal is output. In FIG. 4, a count value having five bits is supplied to the selection indicating unit 403. Therefore, as described below, one adjustment operation execute signal is output every time 33 Ref command signals are input. In other words, while 33 Ref command signals are input, 32 Ref execute signals are output and one adjustment operation execute signal is output.

The selection indicating unit 403 has a 2-cycle measurement unit 411, a NOR gate 412 and an AND gate 413.

The 2-cycle measurement unit 411 receives the lowest one bit in the count value of the counter 402 and the Ref command signal, and sets its output A "high" upon receipt of the first Ref command signal that is output after the lowest one bit in the count value of the counter 402 becomes "1". The 2-cycle measurement unit 411 sets its output A "low" upon receipt of the first Ref command signal that is output after the lowest one bit in the count value of the counter 402 becomes "0".

The NOR gate 412 sets its output B "high" once the counter 402 has counted a predetermined number, or once all the input bits have become "0". In other words, the NOR gate 412 keeps the output level "low" until the counter 402 has counted 32 outputs of the Ref execute signal, and changes the output level to "high" once the counter 402 has counted 32 outputs of the Ref execute signal.

The AND gate 413 outputs "high" as a selection indicating signal when both the output A of the 2-cycle measurement unit 411 and the output B of the NOR gate 412 are "high", and otherwise outputs "low".

The execute signal output unit 401 outputs the Ref command signal as a Ref execute command signal as long as the selection indicating signal stays "low". However, when the selection indicating signal is "high", the execute signal output unit 401 outputs an adjustment operation execute signal in response to a Ref command signal.

Figure 5:
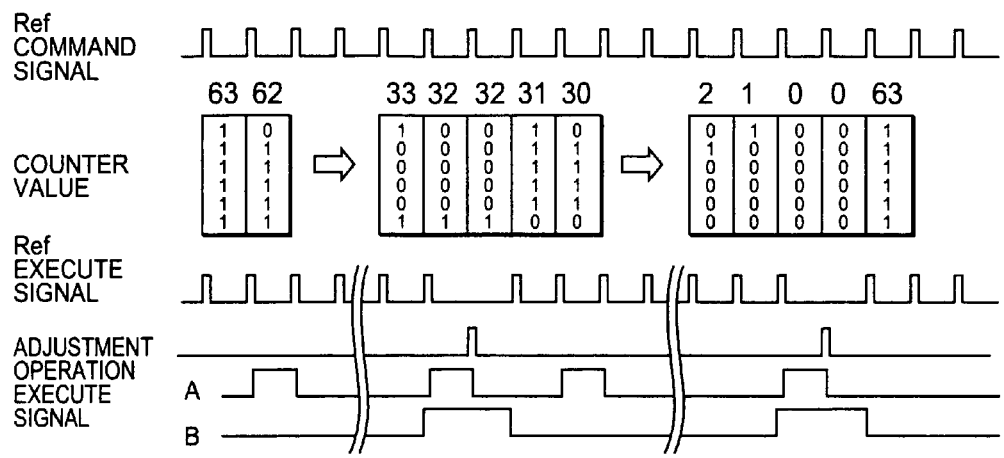
FIG. 5 is a diagram for explaining an operation of the refresh execute signal generator of FIG. 4.

FIG. 5 illustrates a relationship among Ref command signal, counter value of the counter 402, Ref command signal, adjustment operation execute signal, output A of the 2-cycle measurement unit 411, and output B of the NOR gate 412.

As seen from FIG. 5, according to this embodiment, the adjustment operation execute signal is output once every time the Ref command signal is output 32 times. This means that the adjustment operation execute signal is output once every 33 cycles at which the Ref command is input.

The DLL 114 can be activated periodically by supplying the adjustment operation execute signal to the DLL 114. In other words, the delay value of the DLL 114 can be updated periodically. The ZQ calibration (capacity adjustment of the output stage) can be executed periodically by supplying the adjustment operation execute signal to the ZQ calibration circuit 115. However, in order to supply the adjustment operation execute signal to the ZQ calibration circuit 115, two signals SELFEX1 and SELFEX2 having a time difference must be generated from the adjustment operation execute signal.

Thus, this embodiment ensures stable operation even with variation in temperature or voltage, while reducing the power consumption. Moreover, since the DLL 114 and the ZQ calibration circuit 115 are operated only when the refresh operation is not performed. Accordingly, the DLL 114 and the ZQ calibration circuit 115 are allowed to operate with high precision, without being affected by internal noise caused by the refresh operation. The operation of the DLL 114 and ZQ calibration circuit 115 is stopped during the refresh operation, whereby error in the refresh operation itself can be prevented.

Further, according to this first embodiment, the input of the Ref command signal to the counter 402 is inhibited during the output of the adjustment operation execute signal, whereby the count operation of the counter 402 is stopped. Accordingly, the counter 402 can be used also as a refresh counter without causing a problem that refresh is performed with a cell (address) to be refreshed left unrefreshed. Further, although the time required for the refresh is increased according to this embodiment, the increase is not particularly significant, being about 3% (66/64≈1.03).

Next, a second embodiment of this invention will be described.

Figure 6:
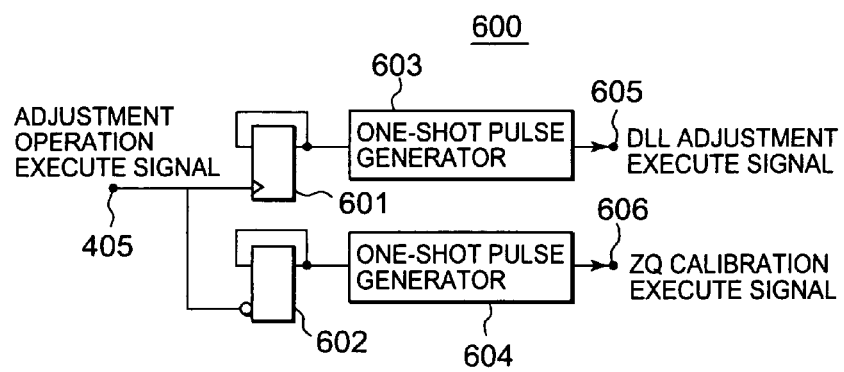
FIG. 6 is a block diagram illustrating a configuration example of an adjustment operation execute signal branching circuit included in a semiconductor device according to a second embodiment of this invention.

A semiconductor device according to the second embodiment has, in addition to the components of the semiconductor device according to the first embodiment described above, an adjustment operation execute signal branching circuit 600 shown in FIG. 6 and included in the refresh (Ref) execute signal generation circuit 400.

The adjustment operation execute signal branching circuit 600 has one-bit counters (e.g., D flip-flops) 601 and 602 connected to the second terminal 405 of the Ref execute signal generation circuit 400 of FIG. 4, and one-shot pulse generators 603 and 604.

One of the one-bit counters, the counter 601 counts adjustment operation execute signals from the execute signal output unit 401. The other one-bit counter 602 counts signals obtained by logically inverting the adjustment operation execute signal from the execute signal output unit 401.

According to this configuration, pulse signals are output alternately from the two one-shot pulse generators 603 and 604 every time an adjustment operation execute signal is output from the execute signal output unit 401. The output pulse signals from the one-shot pulse generators 603 and 604 are output to a third terminal 605 and a fourth terminal 606, respectively.

A pulse signal output to one of the third terminal 605 and the fourth terminal 606 may be used as a first adjustment operation execute signal, and a pulse signal output to the other terminal may be used as a second adjustment operation execute signal. The first adjustment operation execute signal is for example supplied to the DLL 114 as a DLL adjustment operation execute signal, while the second adjustment operation execute signal is for example supplied to the ZQ calibration circuit 115 as a ZQ calibration execute signal. This enables the DLL 114 and the ZQ calibration circuit 115 to operate periodically and alternately. In this case, the adjustment of the DLL 114 is performed once every 66 cycles. The adjustment of the ZQ calibration is also performed once every 66 cycles. Thus, the adjustment of the DLL 114 and the adjustment of the ZQ calibration are performed alternately every 33 cycles.

A third embodiment of this invention will be described below.

A semiconductor device according to this third embodiment has, as shown in FIG. 7A, a selection switch unit 700 included in the refresh (Ref) execute signal generation circuit 400, in addition to the components of the semiconductor device according to the second embodiment.

The selection switch unit 700 provides a path for supplying an adjustment operation execute signal output to the second terminal 405 of the Ref execute signal generation circuit 400 to the DLL 114 that is a circuit to be controlled, without passing the adjustment operation execute signal branching circuit 600, a path for supplying the adjustment operation execute signal to the ZQ calibration circuit 115 also without passing the adjustment operation execute signal branching circuit 600, and a path for supplying the adjustment operation execute signal to the adjustment operation execute signal branching circuit 600. It can also be considered that the selection switch unit 700 is for supplying a specific signal to one of a first circuit to be controlled, a second circuit to be controlled, and the adjustment operation execute signal branching circuit.

The selection switch unit 700 is formed of a plurality of, here, four, switches (e.g., transistor switches) 701 to 704. The turning on and off of these switches 701 to 704 is controlled by the control logic 107. "On" indicates electrical conducting state, and "off" indicates electrical non-conducting state. The control logic 107 controls the switches 701 to 704 on the basis of a data set for controlling the adjustment operation execute signal stored in a mode register 108 that is set from the outside of the semiconductor device.

FIG. 7B illustrates the data set for controlling the adjustment operation execute signal. When the value in the data set is "1", the adjustment operation execute signal is periodically supplied to the DLL 114 or the ZQ calibration circuit 115.

More specifically, the switch 701 is turned off when the data set "DLL, ZQ" is "0, 0" and is otherwise turned on. The switch 702 is turned off when the data set "DLL, ZQ" is "1, 0", and is otherwise turned off. The switch 703 is turned on when the data set "DLL, ZQ" is "0, 1", and is otherwise turned off. The switch 704 is turned on when the data set "DLL, ZQ" is "1, 1", and is otherwise turned off.

The configuration described above makes it possible to selectively realize a first state in which the adjustment operation execute signal is not supplied to either the DLL 114 or the ZQ calibration circuit 115, a second state in which the adjustment operation execute signal is supplied to the DLL 114 but not supplied to the ZQ calibration circuit 115, a third state in which the adjustment operation execute signal is not supplied to the DLL 114 but supplied to the ZQ calibration circuit 115, and a fourth state in which the adjustment operation execute signal is alternately supplied to the DLL 114 and the ZQ calibration circuit 115. The DLL 114 has an OR gate (not shown) which receives a plurality of signals from output nodes of a plurality of switches (702, 704) respectively corresponding to the second state and the fourth state, and it is controlled by the output of the OR gate whether the DLL 114 is activated or not. Thus, the DLL 114 is activated if any of the switches is turned on. The ZQ calibration circuit 115 has an OR gate (not shown) which receives a plurality of signals from output nodes of a plurality of switches (703, 704) respectively corresponding to the third state and the fourth state, and it is controlled by the output of the OR gate whether the ZQ calibration circuit 115 is activated or not. Thus, the ZQ calibration circuit 115 is activated if any of the switches is turned on. It should be noted that the selection switch unit 700 is capable of exhibiting the advantages of this invention only if it is provided with the switch 702 and the switch 703.

The switch 701 can be provided between the NOR gate 412 and the AND gate 413 and the switches 702 to 704 can be connected to the second terminal 405 so that the refresh operation can be carried out without stopping the operation of the counter 402 when the data set "DLL, ZQ" is "0, 0".

Next, a fourth embodiment of this invention will be described with reference to FIG. 8.

The semiconductor device according to this fourth embodiment is a memory module 800 having a plurality of memory devices (DRAMs) according to any of the first to third embodiments. The memory module 800 has a plurality of DRAMs 801 and a module board 802 on which the DRAMs 801 are mounted.

Figure 9:
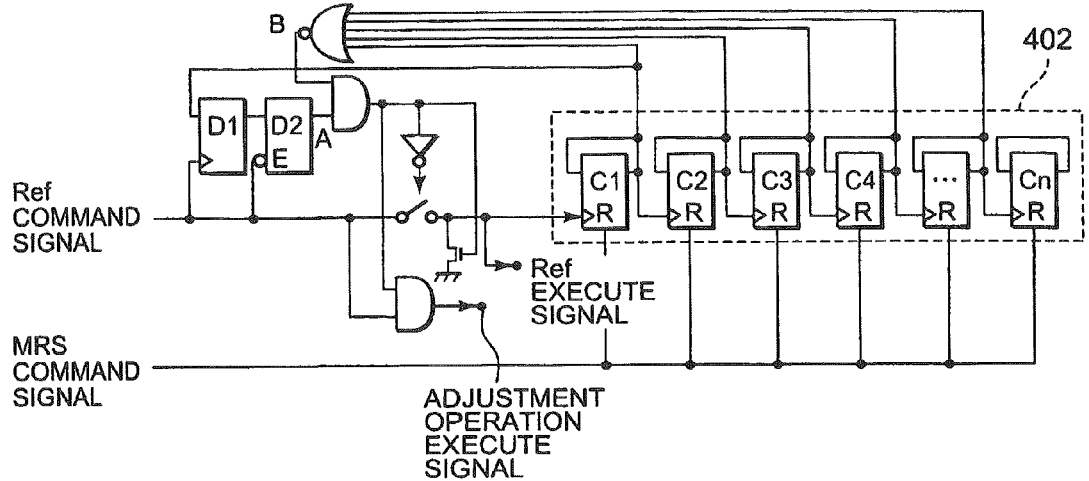
FIG. 9 is a circuit diagram illustrating a configuration example of a refresh execute signal generator provided in each memory device included in the semiconductor device of FIG. 8.

The DRAMs 801 are supplied with a common command (CMD). Therefore, these DRAMs 801 are supposed to concurrently perform a refresh operation once they are given a Ref command. However, if the counters (402 in FIG. 4) of the DRAMs 801 have different counter values, a situation may arise in which some of the DRAMs perform updating of the DLL delay values and the other DRAMs perform the refresh operation. Since these DRAMs 801 have a common power supply, the DRAMs may be affected by variation in supply voltage caused by operation of other DRAMs. This means that some of the DRAMs may be obliged to update the delay value of the DLL 114 in an unstable condition of the supply voltage caused by the refresh operation of the other DRAMs. In this fourth embodiment, therefore, the counters (402 in FIG. 4) of all the DRAMs 801 are previously reset. This resetting can be done, for example, using a MRS (mode register set) command or the like. Specifically, as shown in FIG. 9, a MRS command signal is supplied to the reset terminal R of each of the one-bit counters forming the counter 402. This makes it possible to set the same count value in the counters of all the DRAMs 801, and to enable all the DRAMs 801 to perform the same operation (any of the refresh operation, DLL delay value updating, and ZQ calibration) in response to a Ref command.

Next, a fifth embodiment of this invention will be described with reference to FIG. 10.

The fifth embodiment relates to an information processing system having a memory module having at least one DRAM according to any of the first to third embodiments.

Figure 10:
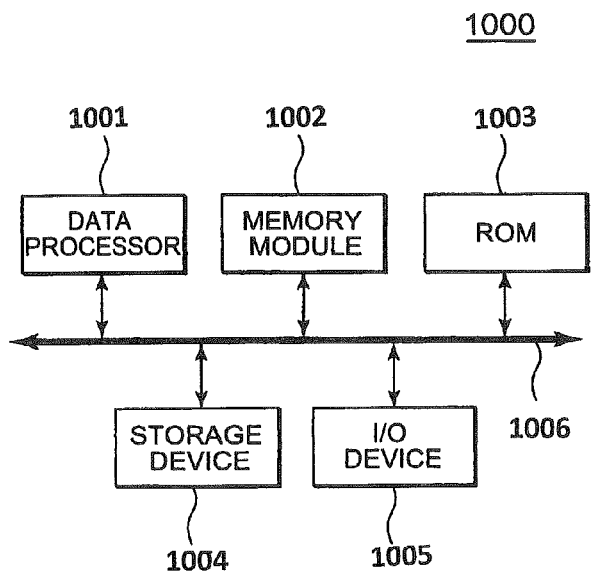
FIG. 10 is a block diagram illustrating a configuration example of a semiconductor device according to a fifth embodiment of this invention.

The information processing system 1000 illustrated in FIG. 10 has a data processor 1001, a memory module 1002, a ROM (Read Only Memory) 1003, a storage device 1004, an I/O (input/output) device 1005, and a system bus 1006 for interconnecting these components.

The data processor 1001 may be, but is not limited to, a microprocessor (MPU) or a digital signal processor (DSP).

The storage device 1004 may be a hard disk drive, an optical disk drive, or a flash memory.

The I/O device 1005 may be a display device such as a liquid crystal display, or an input device such as a keyboard or a mouse.

It should be noted that the ROM 1003, the storage device 1004, and the I/O device 1005 are not necessarily essential to the information processing system 1000. One or two or more of these may be connected or not connected according to an intended use of the information processing system.

The data processor 1001 and the memory module 1002 may be connected through a local bus depending on the system configuration. Further, the components may be interconnected by using a plurality of buses.

Although the invention has been described in connection with several preferred embodiments thereof, it will be appreciated by those skilled in the art that those embodiments are provided solely for illustrating the invention, and should not be relied upon to construe the appended claims in a limiting sense. The invention is not limited to those embodiments, but various changes and modification are possible.

Figure 11:
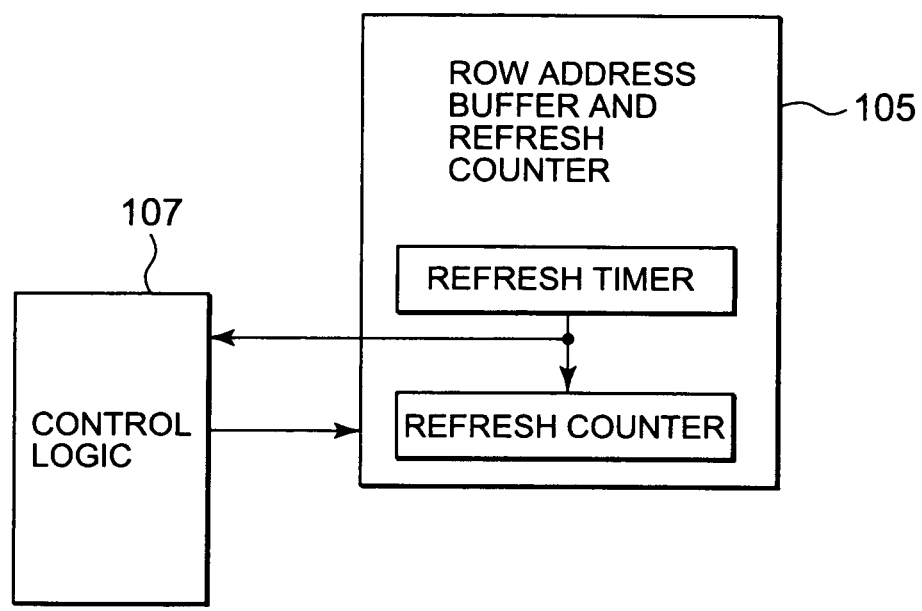
FIG. 11 is a block diagram for explaining a refresh timer.

For example, the description of the embodiments above has been made in terms of a case in which the Ref signal is used as the specific signal. However, it is also possible to use a refresh clock from a refresh timer as the specific signal. The refresh timer is arranged for example in the row address buffer and refresh counter 105 as shown in FIG. 11, and provides a refresh clock to the refresh counter during the self-refresh period. This configuration enables the semiconductor device to periodically perform the delay value adjustment of the DLL 114 and the ZQ calibration even during the refresh period. As a result, the time required before an external command can be input after exit from the self-refresh mode (the number of return latencies from power-down mode to active mode) can be reduced. In this case as well, the refresh counter can be used as the counter 402 of the Ref execute signal generation circuit 400. Then, the refresh timer may be provided in the control logic 107. The refresh timer can be utilized also an internal timer which serves for another purpose in the semiconductor device.

Furthermore, the 2-cycle measurement unit 411 in the selection indicating unit 403 may be replaced with a 3-cycle measurement unit. In this case, the adjustment operation execute signal branching circuit 600 activates the DLL 114 and the ZQ calibration circuit 115 in response to the refresh (Ref) command signal that is supplied twice after a predetermined number of refresh operations. In other words, the adjustment operation execute signal branching circuit 600 successively generates one DLL adjustment operation command signal and one ZQ calibration command signal in response to the adjustment operation execute signal successively output twice. It does not matter which of the DLL adjustment operation command signal and the ZQ calibration command signal is generated first.

Further, the mode register 108 may be either volatile or nonvolatile.

Furthermore, although the description of the embodiments above has been made in terms of an example in which the DLL or the ZQ calibration circuit is activated in response to the Ref command for refreshing the volatile memory cell, the basic technical idea of this invention is not limited to this, but the invention is also applicable to a nonvolatile memory with memory cells the information holding characteristics of which depend on temperature. When this invention is applied to such a nonvolatile memory, another periodical command may be used as the specific signal in place of the Ref command.

The circuit configurations shown in FIGS. 4, 6 and 7 are illustrative only, and any other configuration can be employed as long as it is capable of achieving the operation for which the circuit is designed.

The basic technical idea of this invention is applicable to various semiconductor devices. For example, this invention is applicable to semiconductor devices in general having a memory function, such as CPU (Central Processing Unit), MCU (Micro Control Unit), DSP (Digital Signal Processor), ASIC (Application Specific Integrated Circuit), and ASSP (Application Specific Standard Circuit). These semiconductor devices to which the invention is applied can be productized, for example, as SOC (System On Chip), MCP (Multi Chip Package), and POP (Package On Package). This invention is applicable to all these semiconductor devices having any of these product forms or package forms.

Further, the transistors used in this invention can be field effect transistors (FETs), and various FETs including not only MOS (Metal Oxide Semiconductor) FETs but also MIS (Metal-Insulator Semiconductor) and TFT (Thin Film Transistor) FETS can be used. Still further, the semiconductor device may include a bipolar transistor in a part thereof, or other transistors than FETs may be used.

A variety of combinations and selections of the disclosed elements are possible within the scope of the invention as defined in the appended claims. It should be understood that this invention includes various modifications and changes that will occur to those skilled in the art in the light of the foregoing disclosure and technical ideas.

What is claimed is:

1. A semiconductor device comprising:
a plurality of external terminals configured to be supplied with a plurality of command information;
a command decoder coupled to the external terminals and configured to output a command signal based on the command information; and
a signal generation circuit configured to trigger a first operation in response to each of a plurality of occurrences of the command signal, the signal generation circuit being further configured to trigger a second operation other than the first operation in response to the command signal that occurs subsequently to the plurality of occurrences of the command signal;
wherein the signal generation circuit includes a counter updating a count value thereof each time the command signal occurs to detect the plurality of occurrences of the command signal.

2. The semiconductor device as claimed in claim 1, wherein the command decoder receives a chip select signal, a row address strobe signal, a column address strobe signal, and a write enable signal, and decodes a command consisting of a combination of the chip select signal, the row address strobe signal, the column address strobe signal, and the write enable signal.

3. The semiconductor device as claimed in claim 1, further comprising a plurality of memory cells, a refresh counter, and a DLL circuit generating a clock signal;
wherein the command signal is a refresh command signal;
wherein the first operation is to activate the refresh counter circuit to refresh data stored in the memory cells; and
wherein the second operation is to activate the DLL circuit to update a delay value of the DLL circuit.

4. The semiconductor device as claimed in claim 1, further comprising a plurality of memory cells, a refresh counter, and a ZQ calibration circuit coupled to an external terminal;
wherein the command signal is a refresh command signal;
wherein the first operation is to activate the refresh counter to refresh data stored in the memory cells; and
wherein the second operation is to active the ZQ calibration circuit to adjust the impedance of the external terminal.

5. The semiconductor device as claimed in claim 1, further comprising a plurality of memory cells, a refresh counter, a DLL circuit, and a ZQ calibration circuit coupled to an external terminal;
wherein the command signal is a refresh command signal;
wherein the first operation is to activate the refresh counter to refresh data stored in the memory cells; and
the second operation is to activate a selected one of the DLL circuit and the ZQ calibration circuit, the DLL circuit updating, when activated, a delay value of the DLL circuit, and the ZQ calibration circuit adjusting, when activated, the impedance of the external terminal.

6. The semiconductor device as claimed in claim 1, wherein the counter is reset to an initial value by a reset signal.

7. The semiconductor device as claimed in claim 6, further comprising a mode register supplied with a mode register set signal to store information controlling an operation of the semiconductor device, the mode register set signal being used as the reset signal.

8. A semiconductor device comprising:
a first circuit performing a first operation in response to a first control signal supplied thereto;
a second circuit performing a second operation in response to a second control signal supplied thereto;
a signal generation circuit responding to a plurality of occurrences of a command signal to produce the first control signal a first plurality of times and thereafter produce the second control signal at least once, followed by further producing the first control signal a second plurality of times; and
a command decoder outputting the command signal;
wherein the signal generation circuit includes a counter updating a count value thereof each time the command signal occurs to detect the plurality of occurrences of the command signal.

9. The semiconductor device as claimed in claim 8, wherein:
the first circuit is a refresh counter that is activated in response to the first control signal to refresh data stored in memory cells;
the second circuit is a DLL circuit that is activated in response to the second control signal to update a delay value thereof; and
the command signal is a refresh command signal that instructs the semiconductor device to refresh the memory cells.

10. The semiconductor device as claimed in claim 9, wherein the signal generation circuit further produces the second control signal at least once after producing the first control signal the second plurality of times.

11. The semiconductor device as claimed in claim 8, wherein:
the first circuit is a refresh counter that is activated in response to the first control signal to refresh data stored in memory cells;
the second circuit is a ZQ calibration circuit that is activated in response to the second control signal to adjust the impedance of an external terminal; and
the command signal is a refresh command signal that instructs the semiconductor device to refresh the memory cells.

12. The semiconductor device as claimed in claim 11, wherein the signal generation circuit further produces the second control signal at least once after producing the first control signal the second plurality of times.

13. The semiconductor device as claimed in claim 8, wherein the semiconductor device further comprises a third circuit performing a third operation in response to a third control signal supplied thereto; and
wherein the signal generation circuit further produces the third control signal at least once after producing the first control signal the second plurality of times.

14. The semiconductor device as claimed in claim 13, wherein:

the first circuit is a refresh counter that is activated in response to the first control signal to refresh data stored in memory cells;

the second circuit is a DLL circuit that is activated in response to one of the second and third control signals to update a delay value thereof;

the third circuit is a ZQ calibration circuit that is activated in response to the other of the second and third control signals to adjust the impedance of an external terminal; and the command signal is a refresh command signal that instructs the semiconductor device to refresh the memory cells.

15. A semiconductor device comprising:

an input terminal supplied with a command signal;

a counter updating a count value thereof each time an input signal is supplied to thereto;

a decoder coupled to the counter to decode the count value of the counter, the decoder producing an output signal that takes an active level when the count value is in a target value and an inactive level when the count value is out of the target value;

a signal output circuit coupled between the input terminal and the counter and configured to allow the command signal to be supplied to the counter as the input signal in response to the output signal of the decoder taking the inactive level, to prevent the command signal from being supplied to the counter as the input signal in response to the output signal of the decoder taking the active level, and to produce a first control signal triggering a first operation in response to the command signal that is allowed to be supplied to the counter and a second control signal triggering a second operation in response to the command signal that is prevented from being supplied to the counter.

16. The semiconductor device as claimed in claim 15, further comprising a measurement circuit that makes the signal output circuit allow a new command signal, which is supplied next to the command signal that has been prevented from being supplied to the counter, to be supplied to the counter as the input signal irrespective of the output signal of the counter taking the active level.

17. The semiconductor device as claimed in claim 16, wherein the count value of the counter becomes out of the target value in response to the new command signal being supplied to the counter as the input signal so that the output signal is changed from the active level to the inactive level.

18. The semiconductor device as claimed in claim 17, further comprising:

a refresh counter performing the first operation to refresh data stored in memory cells; and a DLL circuit performing the second operation to update a delay value thereof.

19. The semiconductor device as claimed in claim 17, further comprising:

a refresh counter performing the first operation to refresh data stored in memory cells; and a ZQ calibration circuit performing the second operation to adjust the impedance of an external terminal.

20. The semiconductor device as claimed in claim 17, wherein the device further comprises:

a refresh counter performing the first operation to refresh data stored in memory cells;

a DLL circuit;

a ZQ calibration circuit; and a selection circuit responding to the second control signal to change between first and second states, the first state being to select the DLL circuit, and the second state being to select the ZQ calibration circuit;

wherein in response to the first state of the selection circuit, the DLL circuit performs the second operation to update a delay value thereof; and wherein in response to the second state of the selection circuit, the ZQ calibration circuit performing the second operation to adjust the impedance of an external terminal.

21. The semiconductor device as claimed in claim 20, wherein the selection circuit changed between the first and second states alternately in response to the second control signal.

22. The semiconductor device as claimed in claim 17, wherein the counter is reset to an initial value by a reset signal.

23. The semiconductor device as claimed in claim 22, further comprising a mode register supplied with a mode register set signal to store information controlling an operation of the device, the mode register set signal being used as the reset signal.

* * * * *